US011363736B2

(12) United States Patent
Li

(10) Patent No.: US 11,363,736 B2
(45) Date of Patent: Jun. 14, 2022

(54) CABLE MANAGEMENT ARM AND RACK APPLYING THE CABLE MANAGEMENT ARM

(71) Applicant: Celestica Technology Consultancy (Shanghai) Co. Ltd, Shanghai (CN)

(72) Inventor: Wenjin Li, Shanghai (CN)

(73) Assignee: Celestica Technology Consultancy (Shanghai) Co. Ltd, Shanghai (CN)

( * ) Notice: Subject to any disclaimer, the term of this patent is extended or adjusted under 35 U.S.C. 154(b) by 0 days.

(21) Appl. No.: 16/871,059

(22) Filed: May 11, 2020

(65) Prior Publication Data

US 2021/0259128 A1 Aug. 19, 2021

(30) Foreign Application Priority Data

Feb. 17, 2020 (CN) .......................... 202010096728.4
Feb. 17, 2020 (CN) .......................... 202020181460.X

(51) Int. Cl.
*H05K 7/14* (2006.01)

(52) U.S. Cl.
CPC ......... *H05K 7/1491* (2013.01); *H05K 7/1492* (2013.01)

(58) Field of Classification Search
CPC .......... H02G 3/32; H02G 3/0437; H05K 7/14; H05K 7/1491; H05K 7/1492; F16L 3/01
See application file for complete search history.

(56) References Cited

U.S. PATENT DOCUMENTS

2016/0186895 A1* 6/2016 Chen ...................... H02B 1/012
                                                                248/68.1
2021/0037672 A1* 2/2021 Tower .................... H05K 7/183

* cited by examiner

*Primary Examiner* — James Wu
*Assistant Examiner* — Hung Q Dang

(57) ABSTRACT

The present disclosure provides a cable management arm and a rack applying the cable management arm. The cable management arm includes: a left cable management assembly, a right cable management assembly, a connection assembly, and an elastic assembly. When a chassis in the rack is pulled out of the rack, the elastic assembly causes the left cable management assembly and the right cable management assembly to move following the movement of the controller at the rear of the chassis in the pulling out direction, and causes the left cable management assembly and the right cable management assembly to reset due to elastic force. The connection assembly and the elastic assembly assist the movement of the left cable management assembly and the right cable management assembly to cause their resetting, and ensure them to move in an approximately horizontal space.

9 Claims, 7 Drawing Sheets

CABLE MANAGEMENT ARM AND RACK APPLYING THE CABLE MANAGEMENT ARM

CROSS REFERENCE TO RELATED APPLICATIONS

This application claims priority of a Chinese Patent Application No. 2020100967284, filed on Feb. 17, 2020, and claims priority of a Chinese Patent Application No. 202020181460X, filed on Feb. 17, 2020, the contents of which are hereby incorporated by reference in their entireties for all purposes.

TECHNICAL FIELD

The present disclosure relates to the technical field of racks, and in particular, to an auxiliary equipment of a rack.

BACKGROUND

When maintaining, the servers or storages need to pull out for a certain distance from the rack where the servers or storages are stored. In order to maintain the servers or storages without cutting power supply, the power cables and signal cables at the back-end of the servers or storages need to move with the servers or storages when pulling out the servers or storages. In order to ensure the smooth movement of these cables, special cable management arms (CMA) are required. Since the rack needs to support the cables of both the left controller and the right controller, it is necessary to design two movement mechanisms to manage the cables.

SUMMARY

The present disclosure provides a cable management arm and a rack applying the cable management arm, for managing cables on the left side and right side of the rack.

The present disclosure provides a cable management arm, including a left cable management assembly, a right cable management assembly, a connection assembly, and an elastic assembly. The left cable management assembly is connected with a left area at a rear end of a rack and receives a cable of a controller disposed in the left area at the rear end of the rack. The right cable management assembly is connected with a right area at the rear end of the rack and receives the cable of the controller disposed in the right area at the rear end of the rack. The connection assembly is connected between the left cable management assembly and the right cable management assembly and supports the left cable management assembly and the right cable management assembly. The elastic assembly is connected with the connection assembly, the left cable management assembly, and the right cable management assembly, respectively. When a chassis in the rack is pulled out of the rack, the elastic assembly causes the left cable management assembly and the right cable management assembly to move following the movement of the controller at the rear of the chassis in the pulling out direction, and causes the left cable management assembly and the right cable management assembly to reset due to elastic force.

In an embodiment of the present disclosure, the left cable management assembly includes a first left connection rack, a second left connection rack, and a left cable management groove. The first left connection rack is fixedly connected with a left post of the rack. The second left connection rack is fixedly connected with a left rear end of the chassis in the rack. The left cable management groove receives the cable of the controller in the left area at the rear end of the rack, one end of the left cable management groove is connected with the first left connection rack and the second left connection rack, and the other end of the left cable management groove is connected to the connection assembly. The right management cable assembly includes a first right connection rack, a second right connection rack, and a right cable management groove. The first right connection rack is fixedly connected with a right post of the rack. The second right connection rack is fixedly connected with a right rear end of the chassis in the rack. The right cable management groove receives the cable of the controller in the right area at the rear end of the rack, one end of the right cable management groove is connected with the first right connection rack and the second right connection rack, and the other end of the right cable management groove is connected to the connection assembly.

In an embodiment of the present disclosure, the left cable management groove and the right cable management groove are U-shaped.

In an embodiment of the present disclosure, the left cable management groove includes a left groove seat, a first left guiding groove body, a second left guiding groove body, a first left connection member, and a second left connection member. The left groove seat includes a left bottom plate, a left groove body disposed on the left bottom plate, and a left guiding post disposed on a bottom of the left bottom plate. The first left guiding groove body is disposed on one side of the left groove seat, and contains a plurality of through holes. The second left guiding groove body is disposed on the other side of the left groove seat, and contains a plurality of through holes. The first left connection member is disposed at the tail end of the first left guiding groove, and is connected with the first left connection rack to fixedly connect the left cable management groove with the left post of the rack. The second left connection member is disposed at the tail end of the second left guiding groove, and is connected with the second left connection rack to fixedly connect the left cable management groove with the left rear end of the chassis in the rack.

In an embodiment of the present disclosure, the right cable management groove includes a right groove seat, a first right guiding groove body, a second right guiding groove body, a first right connection member, and a second right connection member. The right groove seat includes a right bottom plate, a right groove body disposed on the right bottom plate, and a right guiding post disposed on a bottom of the right bottom plate. The first right guiding groove body is disposed on one side of the right groove seat, and contains a plurality of through holes. The second right guiding groove body is disposed on the other side of the right groove seat, and contains a plurality of through holes. The first right connection member is disposed at the tail end of the first right guiding groove, and is connected with the first right connection rack to fixedly connect the right cable management groove with the right post of the rack. The second right connection member is disposed at the tail end of the second right guiding groove, and is connected with the second right connection rack to fixedly connect the right cable management groove with the right rear end of the chassis in the rack.

In an embodiment of the present disclosure, the first left guiding groove body is hinged with the left groove seat; the second left guiding groove body is hinged with the left groove seat; the first right guiding groove body is hinged with the right groove seat; the second right guiding groove body is hinged with the right groove seat.

In an embodiment of the present disclosure, the first left connection member is connected with the first left guiding groove body through a pivot; the second left connection member is connected with the second left guiding groove body through a pivot; the first right connecting member is connected with the first right guiding groove body through a pivot; the second right connection member is connected with the second right guiding groove body through a pivot.

In an embodiment of the present disclosure, the elastic assembly includes a left elastic member, and a right elastic member. The left elastic member causes the left cable management groove to reset due to elastic force when the left cable management groove moves, one end of the left elastic member is connected with the connection assembly, and the other end of the left elastic member is connected with the left guiding post of the left cable management groove. The right elastic member causes the right cable management groove to reset due to elastic force when the right cable management groove moves, one end of the right elastic member is connected with the connection assembly, and the other end of the right elastic member is connected with the right guiding post of the right cable management groove.

In an embodiment of the present disclosure, the left elastic member and the right elastic member include a spring or an elastic belt.

In an embodiment of the present disclosure, the connection assembly includes a cross beam, a left guiding slotted hole, a left connection component, a right guiding slotted hole, and a right connection component. The left guiding slotted hole is disposed at the left side of the cross beam for connecting with the left guiding post of the left cable management groove. The left connection component is connected with the left elastic member. The right guiding slotted hole is disposed at the right side of the cross beam for connecting with the right guiding post of the right cable management groove. The right connection component is connected with the right elastic member. The left guiding post of the left cable management groove moves along the left guiding slotted hole as the left cable management groove moves; the right guiding post of the right cable management groove moves along the right guiding slotted hole as the right cable management groove moves.

The present disclosure also provides a rack applying a cable management arm, the cable management arm includes a left cable management assembly, a right cable management assembly, a connection assembly, and an elastic assembly. The left cable management assembly is connected with a left area at a rear end of a rack, and receives a cable of a controller disposed in the left area at the rear end of the rack. The right cable management assembly is connected with a right area at the rear end of the rack, and receives the cable of the controller disposed in the right area at the rear end of the rack. The connection assembly is connected between the left cable management assembly and the right cable management assembly, and supports the left cable management assembly and the right cable management assembly. The elastic assembly is connected with the connection assembly, the left cable management assembly, and the right cable management assembly, respectively. When a chassis in the rack is pulled out of the rack, the elastic assembly causes the left cable management assembly and the right cable management assembly to move following the movement of the controller at the rear of the chassis in the pulling out direction, and causes the left cable management assembly and the right cable management assembly to reset due to elastic force.

As described above, the cable management arm and the rack applying the cable management arm of the present disclosure have the following beneficial effects.

The present disclosure manages the cables of the left controller and the right controller in the rack through the left cable management assembly and the right cable management assembly. When the left cable management assembly and the right cable management assembly move together with the controller at the rear of the chassis towards the pulling out direction, the connection assembly and the elastic assembly assist the movement of the left cable management assembly and the right cable management assembly to cause the resetting of the left cable management assembly and the right cable management assembly, and ensure the left cable management assembly and the right cable management assembly to move in an approximately horizontal space.

DESCRIPTION OF REFERENCE NUMERALS

Figure 1:
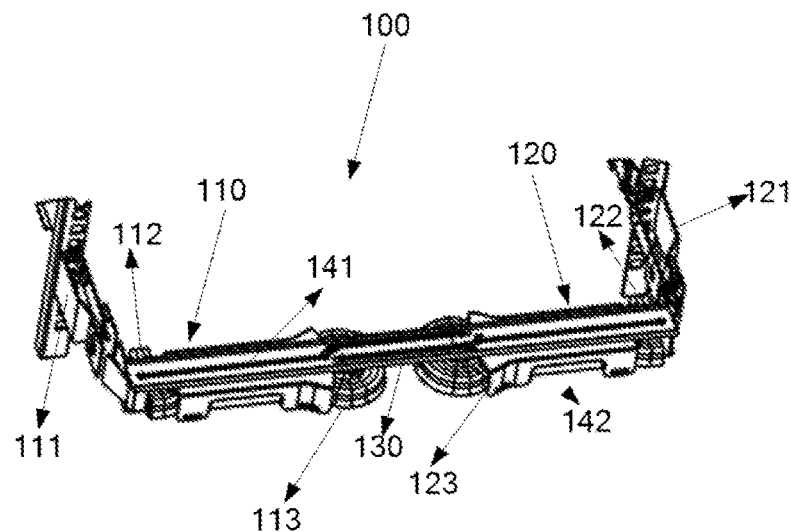
FIG. 1 shows a cable management arm according to the present disclosure.

100 Cable management arm
110 Left cable management assembly
111 First left connection rack
112 Second left connection rack
113 Left cable management groove
1131 Left groove seat
1132 First left guiding groove body
1133 Second left guiding groove body
1134 First left connection member
1135 Second left connection member
1136 Through hole
1137 Left guiding post
120 Right cable management assembly
121 First right connection rack
122 Second right connection rack
123 Right cable management groove
1231 Right groove seat
1232 First right guiding groove body
1233 Second right guiding groove body
1234 First right connection member
1235 Second right connection member
1236 Hinge member
1237 Pivot 1238 Through hole
1239 Right guiding post
130 Connection assembly
131 Left guiding slotted hole
132 Left connection component
133 Right guiding slotted hole
134 Right connection component
141 Left elastic member
142 Right elastic member
200 Rack
210 Chassis
220 Left track
230 Right track
240 First post
250 Second post
260 Third post
270 Fourth post
280 Controller

DETAILED DESCRIPTION OF THE
PREFERRED EMBODIMENTS

The embodiments of the present disclosure will be described below with exemplary examples. Those skilled in the art can easily understand other advantages and effects of the present disclosure from the content disclosed in this specification.

Referring to FIGS. 1 to 10. It should be noted that the structures, proportions, sizes, etc. shown in the drawings in this specification are only used to match the contents disclosed in the description for those familiar with this technology to understand and read. Limited conditions, so it does not have technical significance. Any modification of the structure, change of the proportional relationship or adjustment of the size shall fall within the scope of the present disclosure without affecting the effects and goals that can be achieved The disclosed technical content must be within the scope. At the same time, the terms such as "up", "down", "left", "right", "middle", and "a", "an" cited in this specification are only for the convenience of description, and are not intended to limit the text. The scope of the disclosure that can be implemented, and the changes or adjustments in its relative relationship, should be regarded as the scope in which the disclosure can be implemented without substantial changes in the technical content.

The present embodiment provides a cable management arm and a rack applying the cable management arm to manage the cables on the left side and the right side of the rack.

The following will explain the principle and implementation in detail of a cable management arm and a rack applying the cable management arm in this embodiment, so that those skilled in the art can understand the cable management arm and the rack applying the cable management arm without creative work.

Figure 2:
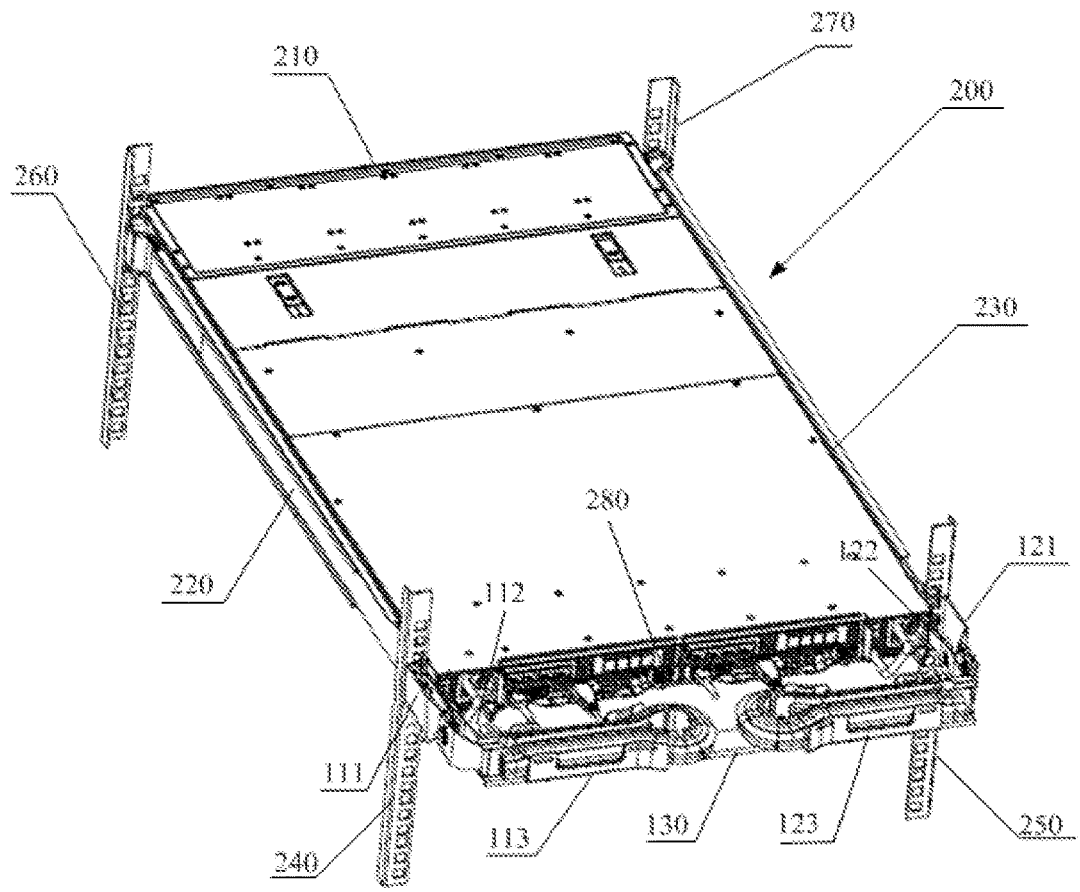
FIG. 2 shows an assembly structure of the cable management arm in a rack according to the present disclosure.

As shown in FIG. 1 and FIG. 2, this embodiment provides a cable management arm 100. The cable management arm 100 includes a left cable management assembly 110, a right cable management assembly 120, a connection assembly 130, and an elastic assembly.

The left management cable assembly 110, the right management cable assembly 120, the connection assembly 130, and the elastic assembly of the cable management arm 100 in this embodiment are described in detail below.

In this embodiment, the rack 200 includes four posts (the first post 240, the second post 250, the third post 260, and the fourth post 270), and a pallet for carrying a chassis 210.

The pallet is disposed between the four posts. Tracks (a left track 220 and a right track 230) are disposed on both sides of the pallet. The rear end of the chassis 210 contains a plurality of controllers 280. The cables of the controller 280 in the rack 200 wires on the left side and the right side, so that wirings are distributed on both sides of the rack 200.

When the chassis 210 is placed on the track, the chassis 210 can be pulled out from the rack 200. At this time, the controller 280 in the left area at the rear end of the rack 200 and the controller 280 in the right area at the rear end of the rack 200 are pulled out from the rack 200 together with the chassis 210, the cables of the controller 280 drive the left cable management assembly 110 and the right cable management assembly 120 to move forward.

In this embodiment, the left cable management assembly 110 is connected to the left area at the rear end of the rack 200, and receives the cable of the controller 280 disposed in the left area at the rear end of the rack 200.

Specifically, in this embodiment, the left cable management assembly 110 includes a first left connection rack 111, a second left connection rack 112, and a left cable management groove 113.

The first left connection rack 111 is fixedly connected to a left post (i.e., the first post 240) of the rack 200. The second left connection rack 112 is fixedly connected to the left rear end of the chassis 210 in the rack 200. One end of the left cable management groove 113 is connected to the first left connection rack 111 and the second left connection rack 112 respectively, and the other end of the left cable management groove 113 is connected to the connection assembly 130 for receiving the cables of the controller 280 in the left area at the rear end of the rack 200.

In this embodiment, the first left connection rack 111 is fixed on the first post 240 of the rack 200. The first left connection rack 111 may be fixed to the post of the rack 200 by using fixing components, such as screws.

Figure 3:
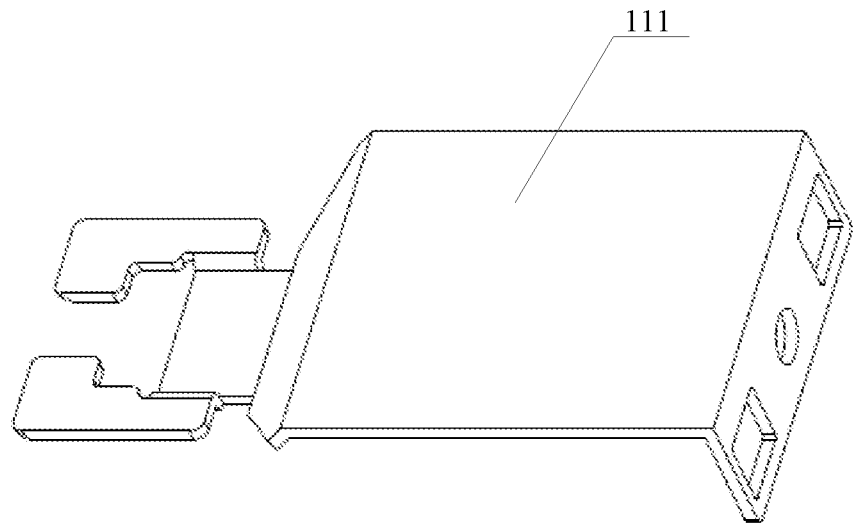
FIG. 3 shows the first left connection rack and the first right connection rack according to the present disclosure.

Specifically, in this embodiment, the first left connection rack 111 is shown in FIG. 3. The first left connection rack 111 includes a support plate, a fixed end disposed at one end of the support plate for fixing the first left connection rack 111 to the post of the rack 200, and a connection end for connecting with the left cable management groove 113. The fixed end has a certain angle relative to the support plate. The fixed end has a through hole, through which the first left connection rack 111 is fixed on a post of the rack 200 by a fixing component, such as a screw. The connection end of the first left connection rack 111 may be a snap structure.

The specific structure of the first left connection rack 111 is not specifically limited in this embodiment, and any structure that can fix the first left connection rack 111 to the posts of the rack 200 can be applied to this embodiment.

Figure 4:
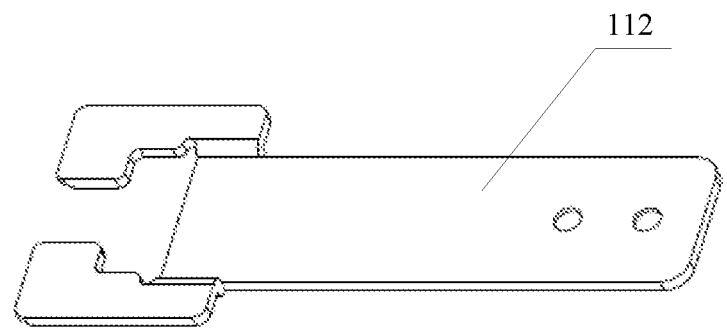
FIG. 4 shows the second left connection rack and the second right connection rack according to the present disclosure.

In this embodiment, the second left connection rack 112 is connected to the chassis 210, and the second left connection rack 112 is shown in FIG. 4. The second left connection rack 112 includes a connection plate and a connection end. The connection plate is connected with the rear end of the chassis 200, and has a connection hole. The connection end is connected with the left cable management groove 113, and has a snap structure. The connection plate may connect the second left connection rack 112 to the rear end of the chassis 210 by fixing components, such as screws. The specific structure of the second left connection rack 112 is not specifically limited in this embodiment, and any structure that can fix the second left connection rack 112 to the rear end of the chassis 200 can be applied to this embodiment.

In this embodiment, one end of the left cable management groove 113 is connected with the first left connection rack 111 and the second left connection rack 112, respectively, and the other end of the left cable management groove 113 is connected to the connection assembly 130 for receiving the cables of the controller 280 in the left area at the rear end of the rack 200.

Figure 5:
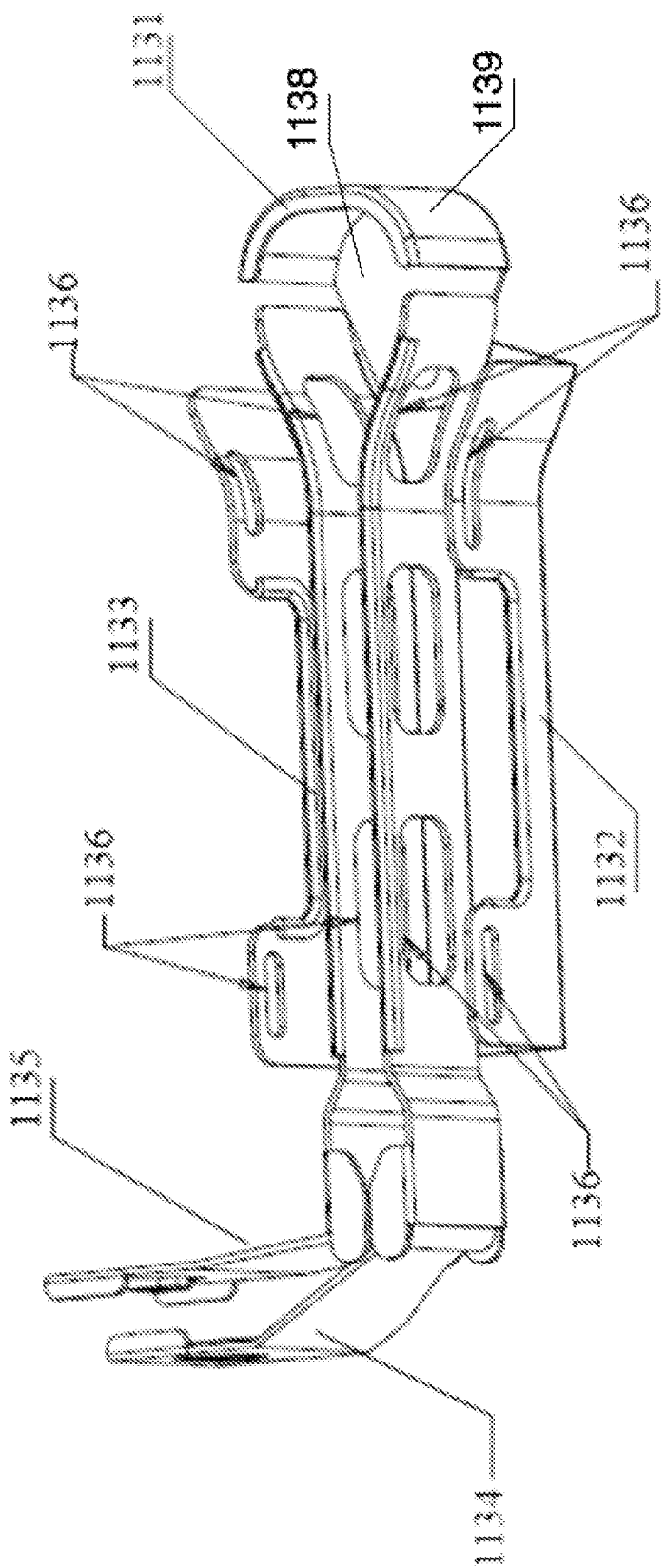
FIG. 5 shows a front view of the left cable management groove according to the present disclosure.
Figure 6:
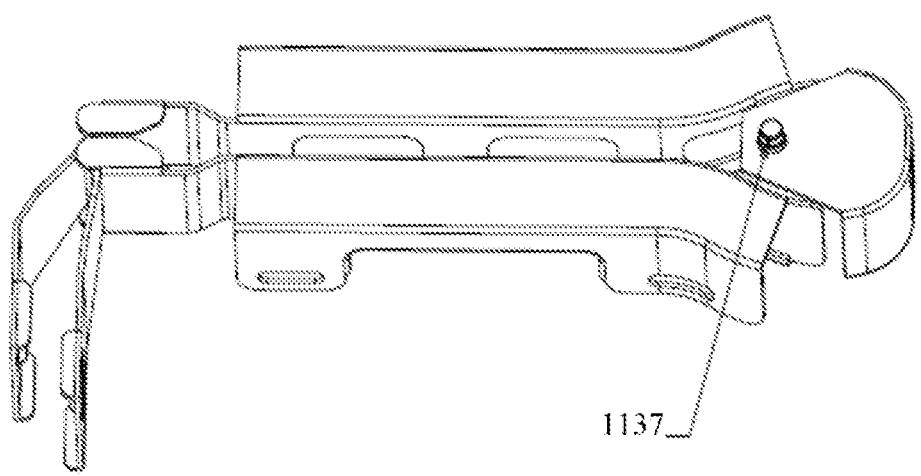
FIG. 6 shows a back view of the left cable management groove according to the present disclosure.

Specifically, as shown in FIG. 5 and FIG. 6, in this embodiment, the left cable management groove 113 includes a left groove seat 1131, a first left guiding groove body 1132, a second left guiding groove body 1133, a first left connection member 1134, and a second left connection member 1135.

In this embodiment, the left cable management groove 113 is U-shaped. In this embodiment, the left groove seat 1131 includes a left bottom plate 1138, a left groove body 1139 disposed on the left bottom plate 1138, and a left guiding post 1137 disposed on the bottom of the left bottom plate 1138. The left groove body 1139 is vertically disposed on the top surface of the left bottom plate 1138. The left groove body 1139 is arc-shaped. The left bottom plate 1138 and the left groove body 1139 form a U-shaped receiving cavity. The left guiding post 1137 is vertically disposed on the bottom surface of the left bottom plate 1138.

In this embodiment, the first left guiding groove body 1132 and the second left guiding groove body 1133 are symmetrically disposed on both sides of the left groove seat 1131.

In this embodiment, the first left guiding groove body 1132 is disposed on one side of the left groove seat 1131, and has a plurality of through holes 1136. The second left guiding groove body 1133 is disposed on the other side of the left groove seat 1131, and also has a plurality of through holes 1136.

The first left guiding groove body 1132 is hinged with the left groove seat 1131, and the second left guiding groove body 1133 is hinged with the left groove seat 1131. The first left guiding groove body 1132 includes a first left guiding groove inner body and a first left guiding groove outer body. The second left guiding groove body 1133 includes a second left guiding groove inner body and a second left guiding groove outer body. The top ends of the first left guiding groove inner body and the second left guiding groove inner body are arc-shaped, and are connected with the left groove body 1139 via a pivot, respectively. A receiving cavity is formed between the first left guiding groove inner body and the second left guiding groove inner body. The first left guiding groove outer body is disposed outside the first left guiding groove inner body, and has a distance from the first left guiding groove inner body. The second left guiding groove outer body is disposed outside the second left guiding groove inner body, and has a distance from the second left guiding groove inner body. The top ends of the first left guiding groove outer body and the second left guiding groove outer body are arc-shaped, and are connected with the left bottom plate 1138 via a pivot, respectively.

In this embodiment, the first left connection member 1134 is disposed at the tail end of the first left guiding groove body 1132, and is connected with the first left connection rack 111, so as to fixedly connect the left cable management groove 113 with the left post of the rack. The first left connection member 1134 is connected to the first left guiding groove body 1132 through a pivot. Specifically, the first left connection member 1134 is connected to the first left guiding groove inner body through a pivot. The first left connection member 1134 and the first left connection rack 111 form a quick release structure.

In this embodiment, the second left connection member 1135 is disposed at the tail end of the second left guiding groove body 1133, and is connected with the second left connection rack 112, to fixedly connect the left cable management groove 113 with the left rear end of the chassis in the rack. The second left connection member 1135 is connected to the second left guiding groove body 1133 through a pivot. Specifically, the second left connection member 1135 is connected to the second left guiding groove inner body through a pivot. The second left connection member 1135 and the second left connection rack 112 form a quick release structure.

In this embodiment, the right cable management assembly 120 is connected to the right area at the rear end of the rack 200 for receiving the cables of the controller 280 disposed in the right area at the rear end of the rack 200.

Specifically, in this embodiment, the right cable management assembly 120 includes a first right connection rack 121, a second right connection rack 122, and a right cable management groove 123.

The first right connection rack 121 is fixedly connected to the right post (i.e. the second post 250) of the rack 200. The second right connection rack 122 is fixedly connected to the right rear end of the chassis 210 in the rack 200. One end of the right cable management groove 123 is connected to the first right connection rack 121 and the second right connection rack 122 respectively, and the other end of the right cable management groove 123 is connected to the connection assembly 130 for receiving the cables of the controller 280 in the right area at the rear end of the rack 200.

In this embodiment, the first right connection rack 121 is fixed on the second post 250 of the rack 200. The first right connection rack 121 may be fixed to the post of the rack 200 by using fixing components, such as screws.

In this embodiment, the first right connection rack 121 is shown in FIG. 3. The first right connection rack 121 includes a support plate, a fixed end disposed at one end of the support plate for fixing the first right connection rack 121 to the post of the rack 200, and a connection end for connecting with the right cable management groove 123. The fixed end has a certain angle relative to the support plate. The fixed end has a through hole, and the first right connection rack 121 is fixed on a post of the rack 200 by a fixing component, such as a screw. The connection end of the first right connection rack 121 may be a snap structure.

The specific structure of the first right connection rack 121 is not specifically limited in this embodiment, and any structure that can fix the first right connection rack 121 to the posts of the rack 200 can be applied to this embodiment.

In this embodiment, the second right connection rack 122 is connected to the chassis 210, and the second right connection rack 122 is capable of being engaged with or disengaged from the rear end of the chassis 210.

The second right connection rack 122 is shown in FIG. 4. The second right connection rack 122 includes a connection plate and a connection end. The connection plate is connected with the rear end of the chassis 200, and has a connection hole. The connection end is connected with the right cable management groove 123, and has a snap structure. The connection plate may connect the second right connection rack 122 to the rear end of the chassis 210 by fixing components, such as screws. The specific structure of the second right connection rack 122 is not specifically limited in this embodiment, and any structure that fix the second right connection rack 122 to the rear end of the chassis 200 can be applied to this embodiment.

Figure 7:
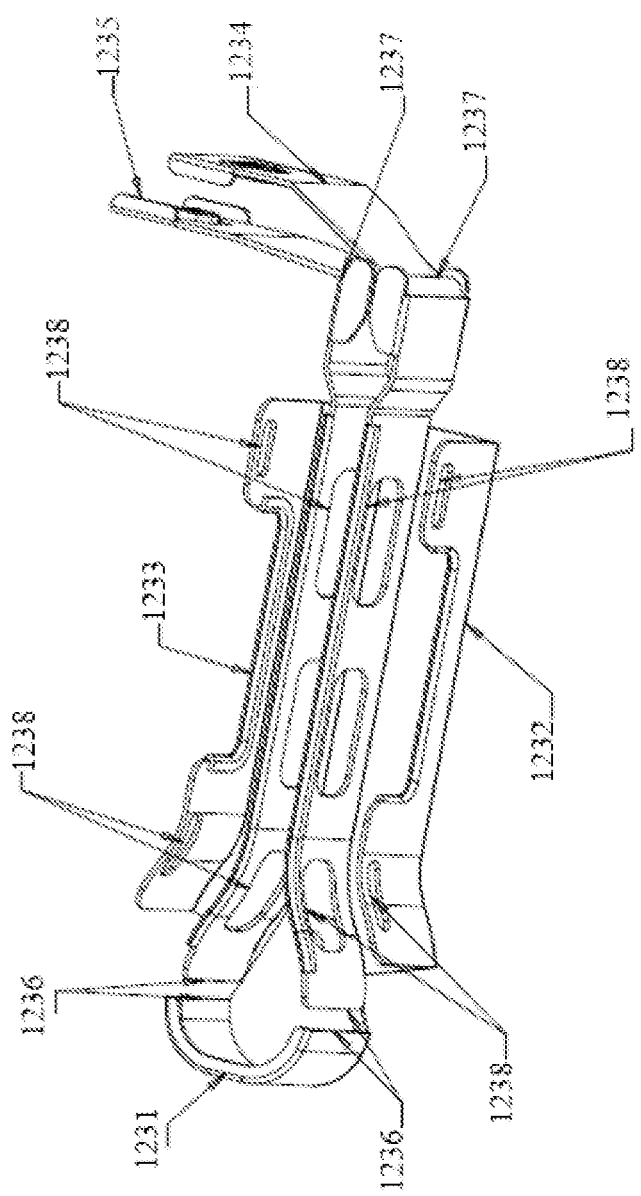
FIG. 7 shows a front view of the right cable management groove according to the present disclosure.
Figure 8:
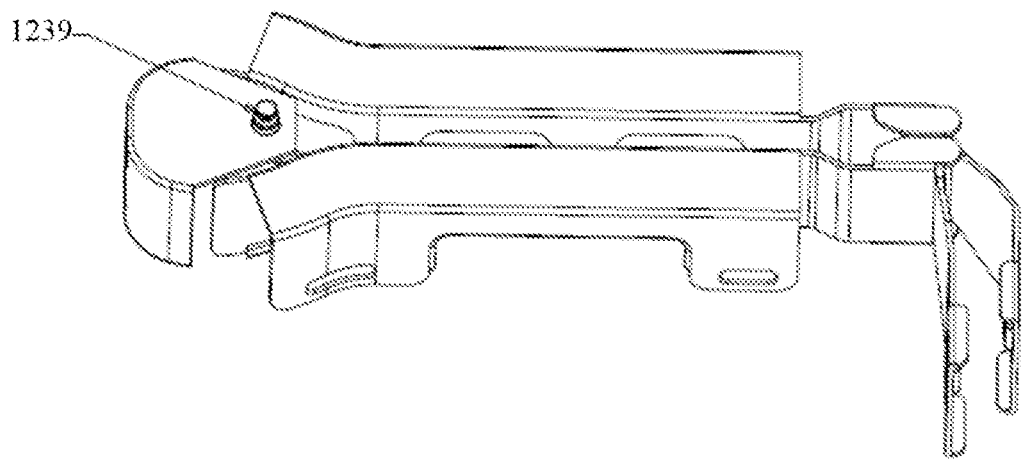
FIG. 8 shows a back view of the right cable management groove according to the present disclosure.

Specifically, as shown in FIG. 7 and FIG. 8, in this embodiment, the right cable management groove 123 includes a right groove seat 1231, a first right guiding groove body 1232, a second right guiding groove body 1233, a first right connection member 1234, and a second right connection member 1235.

In this embodiment, the right cable management groove 123 is U-shaped. In this embodiment, the right groove seat 1231 includes a right bottom plate, a right groove body disposed on the right bottom plate, and a right guiding post 1239 disposed on the bottom of the right bottom plate. The right groove body is vertically disposed on the top surface of the right bottom plate. The right groove body is arc-shaped. The right bottom plate and the right groove body form a U-shaped receiving cavity. The right guiding post 1239 is vertically disposed on the bottom surface of the right bottom plate.

In this embodiment, the first right guiding groove body 1232 and the second right guiding groove body 1233 are symmetrically disposed on both sides of the right groove seat 1231.

In this embodiment, the first right guiding groove 1232 is disposed on one side of the right groove seat 1231, and has a plurality of through holes 1238. The second right guiding groove body 1233 is disposed on the other side of the right groove seat 1231, also has a plurality of through holes 1238.

The first right guiding groove body 1232 is connected to the right groove seat 1231 through a hinge member 1236, and the second right guiding groove body 1233 is connected to the right groove seat 1231 through a hinge member 1236. The first right guiding groove 1232 includes a first right guiding groove inner body and a first right guiding groove outer body. The second right guiding groove body 1233 includes a second right guiding groove inner body and a second right guiding groove outer body. The top ends of the first right guiding groove inner body and the second right guiding groove inner body are arc-shaped, and are connected with the right groove body via a pivot, respectively. A receiving cavity is formed between the first right guiding groove inner body and second right guiding groove inner body. The first right guiding groove outer body is disposed outside the first right guiding groove inner body, and has a distance from the first right guiding groove inner body. The second right guiding groove outer body is disposed outside the second right guiding groove inner body, and has a distance from the second right guiding groove inner body. The top ends of the first right guiding groove outer body and the second right guiding groove outer body are arc-shaped, and are connected with the right bottom plate via a pivot, respectively.

In this embodiment, the first right connection member 1234 is disposed at the tail end of the first right guiding groove body 1232, and is connected with the first right connection rack 121, so as to fixedly connect the right cable management groove 123 with the right post of the rack. The first right connecting member 1234 is connected to the first right guiding groove body 1232 through a pivot 1237. Specifically, the first right connecting end 1234 is connected to first right guiding groove inner body through a pivot 1237. The first right connection member 1234 and the first right connection rack 121 form a quick release structure.

In this embodiment, the second right connection member 1235 is disposed at the tail end of the second right guiding groove body 1233, and is connected with the second right connection rack 122, to fixedly connect the right cable management groove 123 with the right rear end of the chassis in the rack. The second right connection member 1235 is connected to the second right guiding groove body 1233 through a pivot 1237. Specifically, the second right connection member 1235 is connected to the second right guiding groove inner body through a pivot 1237. The second right connection member 1235 and the second right connection rack 122 form a quick release structure.

It can be seen that, in this embodiment, the left cable management groove 113 and the right cable management groove 123 each contains five separate components. The components are connected by hinge structures, such as a pivot. The left cable management groove 113 and the right cable management groove 123 are capable of being extended and reset. In addition, the left cable management groove 113 is connected with the first left connection rack 111 and the second left connection rack 112 through a quick release structure. The right cable management groove 123 is connected with the first right connection rack 121 and the second right connection rack 122 through a quick release structure.

In this embodiment, the elastic assembly is connected with the connection assembly 130, the left cable management assembly 110, and the right cable management assembly 120, respectively. When the chassis 210 in the rack 200 is pulled out of the rack 200, the left cable management assembly 110 and the right cable management assembly 120 move following the controller 280 at the rear end of the chassis 210 toward the pull-out direction. The elastic assembly causes the left cable management assembly 110 and the right cable management assembly 120 to reset due to elastic force.

Specifically, in this embodiment, as shown in FIG. 1, the elastic assembly includes a left elastic member 141 and a right elastic member 142.

In this embodiment, one end of the left elastic member 141 is connected to the connection assembly 130, and the other end of the left elastic member 141 is connected to the left guiding post 1137 of the left cable management groove 113, so as to cause the left cable management groove 113 to reset through the elastic force when the left cable management groove 113 moves.

In this embodiment, one end of the right elastic member 142 is connected to the connection assembly 130, and the other end of the right elastic member 142 is connected to the right guiding post 1239 of the right cable management groove 123, so as to cause the right cable management groove 123 to reset through the elastic force when the right cable management groove 123 moves.

Figure 9:
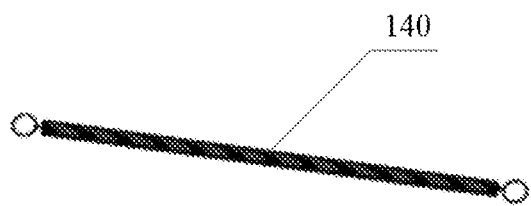
FIG. 9 shows the left elastic member and the right elastic member according to the present disclosure.

Furthermore, in this embodiment, as shown in FIG. 9, the left elastic member 141 and the right elastic member 142 may be, but not limited to, a spring or an elastic belt. The two ends of the left elastic member 141 and the right elastic member 142 have connection sleeves respectively, so that one end of the left elastic member 141 is sleeved on the left guiding post 1137, the other end of the left elastic member 141 is sleeved on the connection assembly 130, and one end of the right elastic member 142 is sleeved on the right guiding post 1239, the other end of the right elastic member 142 is sleeved on the connection assembly 130.

In this embodiment, as shown in FIG. 1 and FIG. 2, the connection assembly 130 is connected between the left cable management assembly 110 and the right cable management assembly 120, and supports the left cable management assembly 110 and the right cable management assembly 120.

Figure 10:
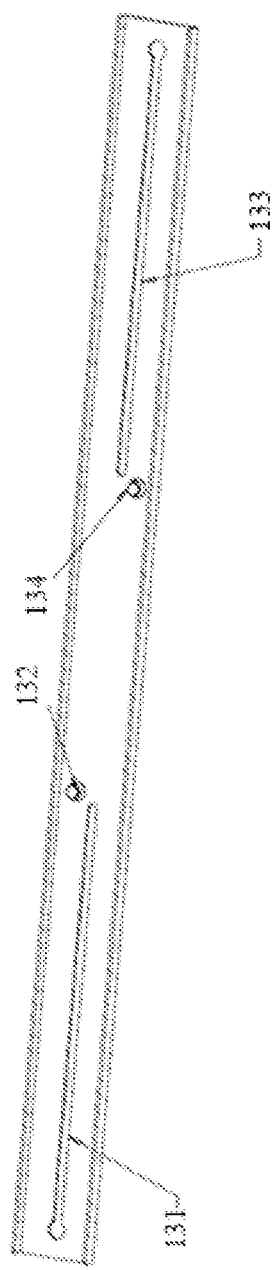
FIG. 10 shows the connection assembly according to the present disclosure.

Specifically, in this embodiment, as shown in FIG. 10, the connection assembly 130 connects to the bottom surfaces of the left cable management assembly 110 and the right cable management assembly 120. The left cable management assembly 110 has a certain distance from the right management cable assembly 120.

Specifically, in this embodiment, the connection assembly 130 includes a cross beam, a left guiding slotted hole 131, a left connection component 132, a right guiding slotted hole 133, and a right connection component 134. The left guiding slotted hole 131 is disposed at the left side of the cross beam for connecting with the left guiding post 1137 of the left cable management groove 113. The left connection component 132 (for example, a connecting post) is connected with the left elastic member 141. The right guiding slotted hole 133 is disposed at the right side of the cross beam for connecting with the right post 1239 of the right cable management groove 123. The right connection component 134 (for example, a connecting post) is connected with the right elastic member 142. The left guiding post 1137 of the left cable management groove 113 moves along the left guiding slotted hole 131 as the left cable management groove 113 moves. The right guiding post 1239 of the right cable management groove 123 moves along the right guiding slotted hole 133 as the right cable management groove 123 moves.

One end of the left elastic member 141 is sleeved on the left guiding post 1137, the other end of the left elastic member 141 is sleeved on the left connecting component 132 of the cross beam. One end of the right elastic member 142 is sleeved on the right guiding post 1239, and the other end of the right elastic member 142 is sleeved on the right connecting component 134 of the cross beam.

The left elastic member 141 and the right elastic member 142 ensure the expansion and reset of the left cable management groove 113 and the right cable management groove 123 during the movement. The left elastic member 141 causes the left groove seat 1131 of the left cable management groove 113 to reciprocate in the left guiding slotted hole 131 (open slot) in the cross beam. The right elastic member 142 causes the right groove seat 1231 of the right cable management groove 123 to reciprocate in the right guiding slotted hole 133 (open slot) in the cross beam. The cross beam moves forwards or backwards along the direction of the chassis together with the left cable management groove 113 and the right cable management groove 123.

Therefore, in the present embodiment, when the chassis 210 in the rack 200 is pulled out of the rack 200, the left cable management groove 113 and the right cable management groove 123 move following the movement of the controller 210 at the rear of the chassis 210 in the pulling out direction. The connection plate and the spring assist the movement of the left cable management groove 113 and the right cable management groove 123, and ensure the movement of the left cable management groove 113 and the right cable management groove 123 to move in an approximately horizontal space. In an 1 U space, the cable management arm always has full-width. While in the present application, the cable management arm 100 has two half-width cable management structures in an 1 U space, and the two cable management structures always move in the 1 U space.

As shown in FIG. 2, this embodiment further provides a rack 200. In the rack 200, the cable management arm 100 described above is applied. The rack 200 includes four posts (a first post 240, a second post 250, a third post 260, and a fourth post 270), and a tray for carrying the chassis 210 between the four posts. Tracks (left track 220 and right track 230) are disposed on the two sides of the tray. A plurality of controllers 280 is disposed at the rear of the chassis 210. The cable management arm 100 is disposed at the rear of the rack 200. The cable management arm 100 is connected with the posts of the rack 200 and the rear of the chassis 210. The cable management arm 100 has been described above, and will not be described in detail herein.

In summary, the present disclosure manages the cables of the left controller and the right controller in the rack through the left cable management assembly and the right cable management assembly. When the left cable management assembly and the right cable management assembly move together with the controller at the rear of the chassis towards the pulling out direction, the connection assembly and the elastic assembly assist the movement of the left cable management assembly and the right cable management assembly, to cause the resetting of the left cable management assembly and the right cable management assembly, and ensure the left cable management assembly and the right cable management assembly to move in an approximately horizontal space. Therefore, the present disclosure effectively overcomes various shortcomings in the prior art and has high industrial utilization value.

The above-mentioned embodiments merely illustrate the principle of the present disclosure and its effects, but are not intended to limit the present disclosure. Anyone familiar with this technology can modify or change the above embodiments without departing from the spirit and scope of the present disclosure. Therefore, all equivalent modifications or changes made by those with ordinary knowledge in the technical field to which they belong without departing from the spirit and technical ideas disclosed by the present disclosure should still be covered by the claims of the present disclosure.

The invention claimed is:

1. A cable management arm, comprising:
   a left cable management assembly, connected with a left area at a rear end of a rack, and receiving a cable of a controller disposed in the left area at the rear end of the rack;
   a right cable management assembly, connected with a right area at the rear end of the rack, and receiving a cable of the controller disposed in the right area at the rear end of the rack;
   a connection assembly, connected between the left cable management assembly and the right cable management assembly, and supporting the left cable management assembly and the right cable management assembly; and
   an elastic assembly, connected with the connection assembly, the left cable management assembly, and the right cable management assembly, respectively;
   wherein when a chassis in the rack is pulled out of the rack, the elastic assembly causes the left cable management assembly and the right cable management assembly to move following the movement of the controller at a rear of the chassis in a pulling out direction, and causes the left cable management assembly and the right cable management assembly to reset due to elastic force;
   wherein the left cable management assembly comprises:
   a first left connection rack, fixedly connected with a left post of the rack,
   a second left connection rack, fixedly connected with a left rear end of the chassis in the rack, and
   a left cable management groove, receiving the cable of the controller in the left area at the rear end of the rack, one end of the left cable management groove is connected with the first left connection rack and the second left connection rack, and the other end of the left cable management groove is connected with the connection assembly, wherein the left cable management groove comprises:
  a left groove seat, including a left bottom plate, a left groove body disposed on the left bottom plate, and a left guiding post disposed on a bottom of the left bottom plate,
  a first left guiding groove body, disposed on one side of the left groove seat, and containing a plurality of through holes,
  a second left guiding groove body, disposed on the other side of the left groove seat, and containing a plurality of through holes,
  a first left connection member, disposed at a tail end of the first left guiding groove, and connected with the first left connection rack to fixedly connect the left cable management groove with the left post of the rack, and
  a second left connection member, disposed at a tail end of the second left guiding groove, and connected with the second left connection rack to fixedly connect the left cable management groove with the left rear end of the chassis in the rack;
wherein the right management cable assembly comprises:
  a first right connection rack, fixedly connected with a right post of the rack,
  a second right connection rack, fixedly connected with a right rear end of the chassis in the rack, and
  a right cable management groove, receiving the cable of the controller in the right area at the rear end of the rack, one end of the right cable management groove is connected with the first right connection rack and the second right connection rack, and the other end of the right cable management groove is connected with the connection assembly.

2. The cable management arm according to claim 1, wherein the left cable management groove and the right cable management groove are U-shaped.

3. The cable management arm according to claim 1, wherein the right cable management groove comprises:
  a right groove seat, including a right bottom plate, a right groove body disposed on the right bottom plate, and a right guiding post disposed on a bottom of the right bottom plate;
  a first right guiding groove body, disposed on one side of the right groove seat, and containing a plurality of through holes;
  a second right guiding groove body, disposed on the other side of the right groove seat, and containing a plurality of through holes;
  a first right connection member, disposed at a tail end of the first right guiding groove body, and connected with the first right connection rack to fixedly connect the right cable management groove with the right guiding post of the rack; and
  a second right connection member, disposed at a tail end of the second right guiding groove body, and connected with the second right connection rack to fixedly connect the right cable management groove with the right rear end of the chassis in the rack.

4. The cable management arm according to claim 3, wherein
  the first left guiding groove body is hinged with the left groove seat;
  the second left guiding groove body is hinged with the left groove seat;
  the first right guiding groove body is hinged with the right groove seat; and
  the second right guiding groove body is hinged with the right groove seat.

5. The cable management arm according to claim 3, wherein
  the first left connection member is connected with the first left guiding groove body through a pivot;
  the second left connection member is connected with the second left guiding groove body through a pivot;
  the first right connecting member is connected with the first right guiding groove body through a pivot; and
  the second right connection member is connected with the second right guiding groove body through a pivot.

6. The cable management arm according to claim 3, wherein the elastic assembly comprises:
  a left elastic member, causing the left cable management groove to reset due to elastic force when the left cable management groove moves, one end of the left elastic member is connected with the connection assembly, and the other end of the left elastic member is connected with the left guiding post of the left cable management groove; and
  a right elastic member, causing the right cable management groove to reset due to elastic force when the right cable management groove moves, one end of the right elastic member is connected with the connection assembly, and the other end of the right elastic member is connected with the right guiding post of the right cable management groove.

7. The cable management arm according to claim 6, wherein the left elastic member and the right elastic member include a spring or an elastic belt.

8. The cable management arm according to claim 6, wherein the connection assembly comprises
  a cross beam;
  a left guiding slotted hole, disposed at a left side of the cross beam for connecting with the left guiding post of the left cable management groove;
  a left connection component, connected with the left elastic member;
  a right guiding slotted hole, disposed at a right side of the cross beam for connecting with the right guiding post of the right cable management groove; and
  a right connection component, connected with the right elastic member;
  wherein the left guiding post of the left cable management groove moves along the left guiding slotted hole as the left cable management groove moves; and the right guiding post of the right cable management groove moves along the right guiding slotted hole as the right cable management groove moves.

9. A rack, applying a cable management arm, wherein the cable management arm comprises:
  a left cable management assembly, connected with a left area at a rear end of a rack, and receiving a cable of a controller disposed in the left area at the rear end of the rack;
  a right cable management assembly, connected with a right area at the rear end of the rack, and receiving a cable of the controller disposed in the right area at the rear end of the rack;
  a connection assembly, connected between the left cable management assembly and the right cable management assembly, and supporting the left cable management assembly and the right cable management assembly; and an elastic assembly, connected with the connection assembly, the left cable management assembly, and the right cable management assembly, respectively;

wherein when a chassis in the rack is pulled out of the rack, the elastic assembly causes the left cable management assembly and the right cable management assembly to move following the movement of the controller at a rear of the chassis in a pulling out direction, and causes the left cable management assembly and the right cable management assembly to reset due to elastic force;

wherein the left cable management assembly comprises:
- a first left connection rack, fixedly connected with a left post of the rack,
- a second left connection rack, fixedly connected with a left rear end of the chassis in the rack, and
- a left cable management groove, receiving the cable of the controller in the left area at the rear end of the rack, one end of the left cable management groove is connected with the first left connection rack and the second left connection rack, and the other end of the left cable management groove is connected with the connection assembly, wherein the left cable management groove comprises:
- a left groove seat, including a left bottom plate, a left groove body disposed on the left bottom plate, and a left guiding post disposed on a bottom of the left bottom plate,
- a first left guiding groove body, disposed on one side of the left groove seat, and containing a plurality of through holes,
- a second left guiding groove body, disposed on the other side of the left groove seat, and containing a plurality of through holes,
- a first left connection member, disposed at a tail end of the first left guiding groove, and connected with the first left connection rack to fixedly connect the left cable management groove with the left post of the rack, and
- a second left connection member, disposed at a tail end of the second left guiding groove, and connected with the second left connection rack to fixedly connect the left cable management groove with the left rear end of the chassis in the rack;

wherein the right management cable assembly comprises:
- a first right connection rack, fixedly connected with a right post of the rack,
- a second right connection rack, fixedly connected with a right rear end of the chassis in the rack, and
- a right cable management groove, receiving the cable of the controller in the right area at the rear end of the rack, one end of the right cable management groove is connected with the first right connection rack and the second right connection rack, and the other end of the right cable management groove is connected with the connection assembly.

* * * * *